United States Patent
Chen

(10) Patent No.: US 7,474,085 B2
(45) Date of Patent: Jan. 6, 2009

(54) POWER SUPPLY SWITCH CIRCUIT WITH CURRENT LEAKAGE PROTECTION

(75) Inventor: Yung-Fa Chen, Puli Township, Nantou County (TW)

(73) Assignee: Universal Scientific Industrial Co., Ltd., Nan-Tou (TW)

( * ) Notice: Subject to any disclaimer, the term of this patent is extended or adjusted under 35 U.S.C. 154(b) by 0 days.

(21) Appl. No.: 12/078,493

(22) Filed: Apr. 1, 2008

(65) Prior Publication Data

US 2008/0186007 A1   Aug. 7, 2008

Related U.S. Application Data

(62) Division of application No. 11/330,158, filed on Jan. 12, 2006, now abandoned.

(30) Foreign Application Priority Data

Aug. 16, 2005   (TW)   ............................... 94214004 U

(51) Int. Cl.
*G05F 1/00* (2006.01)
(52) U.S. Cl. ........................................ 323/283; 323/222
(58) Field of Classification Search ................. 323/283, 323/222, 235, 241, 249, 276, 275, 271, 273
See application file for complete search history.

(56) References Cited

U.S. PATENT DOCUMENTS

| | | | | |
|---|---|---|---|---|
| 4,374,356 A | * | 2/1983 | Hashimoto | 323/273 |
| 4,636,705 A | * | 1/1987 | Bowman | 322/28 |
| 5,493,203 A | * | 2/1996 | Dalton | 323/282 |
| 5,631,549 A | * | 5/1997 | Hong | 323/277 |
| 5,815,356 A | * | 9/1998 | Rodriguez et al. | 361/91.6 |
| 5,909,110 A | * | 6/1999 | Yuan et al. | 323/282 |
| 6,424,131 B1 | * | 7/2002 | Yamamoto et al. | 323/282 |

* cited by examiner

*Primary Examiner*—Bao Q Vu
*Assistant Examiner*—Nguyen Tran
(74) *Attorney, Agent, or Firm*—Rosenberg, Klein & Lee

(57) ABSTRACT

A power supply switch circuit with current leakage protection is used in an electronic device, and is able to prevent the erroneous actions caused by a leakage current in high-temperature environments. The power supply switch circuit comprises a transistor having an emitter, a base and a collector, a field effect transistor having a drain, a source and a gate, and at least two series-connected diodes. The emitter is connected to a voltage source. The collector is connected to a load via a forward biased diode. The drain receives a trigger signal. The source is connected a reference terminal via at least two series-connected diodes. The gate is connected to the collector via a second resistor. One terminal of a third resistor is connected to the gate, and the other terminal is connected to the reference terminal.

6 Claims, 3 Drawing Sheets

POWER SUPPLY SWITCH CIRCUIT WITH CURRENT LEAKAGE PROTECTION

RELATED APPLICATIONS

This application is a Divisional patent application of application Ser. No. 11/330,158, filed on 12 Jan. 2006 now abandoned. The entire disclosure of the prior application, Ser. No. 11/330,158, from which an oath or declaration is supplied, is considered a part of the disclosure of the accompanying Divisional/Continuation application and is hereby incorporated by reference.

BACKGROUND OF THE INVENTION

1. Field of the Invention

The present invention relates to a power supply switch circuit with current leakage protection and, more particularly, to a circuit used in an electronic device and capable of preventing the erroneous actions caused by a circuit leakage current in high temperature environments.

2. Description of Related Art

As shown in FIG. 1, a prior art power supply switch circuit is primarily formed by connecting two transistors $Q_1$, $Q_2$ and other electronic components. When power is to be supplied, a trigger signal $S_T$ is used to control the transistor $Q_1$ to be on so that a voltage source $V_{CC}$ can provide power to a load 90 via the transistor $Q_1$. Meanwhile, the supplied power can also be sent to the base of the transistor $Q_2$ to make the transistor $Q_2$ on. After the transistor Q2 is on, the base of the transistor $Q_1$ will be connected to a reference terminal Gnd to keep the transistor $Q_1$ on. When the power is to be cut off, a controller 91 will send a cut-off signal to the transistor $Q_2$ to make the transistor $Q_2$ off. The transistor $Q_1$ will then be off in succession so that the voltage source $V_{CC}$ can no longer provide power to the load 90.

The leakage current of a transistor depends on the working temperature. The magnitude of the leakage current is proportional to temperature. Please refer to FIG. 1 again. According to the transistor's characteristics, when the circuit stops providing power, the transistor $Q_2$ will have a leakage current $I_{CEO}$. When the temperature rises, the leakage current $I_{CEO}$ increases, and the base current $I_{B1}$ flowing through the transistor $Q_1$ increases therewith. Because the collector current $I_C$ is β times the base current $I_B$ according to the transistor's characteristics, the collector current $I_{C1}$ of the transistor $Q_1$ will increase with the base current $I_{B1}$ of the transistor $Q_1$. Similarly, the base current $I_{B2}$ of the transistor $Q_2$ increases with the collector current $I_{C1}$ of the transistor $Q_1$. With the increase of the base current $I_{B2}$ of the transistor $Q_2$, the leakage current $I_{CEO}$ increases. In this vicious circle, the power supply switch circuit will generate erroneous actions. That is, when the power supply switch circuit is originally in the off state (i.e., stops providing power), the transistor $Q_1$ will be on due to the leakage current $I_{CEO}$ to drive the power supply switch circuit into the on state (i.e., starts providing power).

SUMMARY OF THE INVENTION

An object of the present invention is to provide a power supply switch circuit with current leakage protection, which is used in an electronic device and capable of preventing the erroneous actions caused by a circuit leakage current in high temperature environments.

The present invention comprises a transistor, a field effect transistor and a third resistor. The transistor has an emitter, a base and a collector. The emitter is connected to a voltage source. The collector is connected to a load via a forward biased diode. The field effect transistor has a drain, a source and a gate. The drain receives a trigger signal. The source is connected to a reference terminal via at least two series-connected diodes. The gate is connected to the collector via a second resistor. One terminal of the third resistor is connected to the gate, and the other terminal is connected to the reference terminal.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 1:
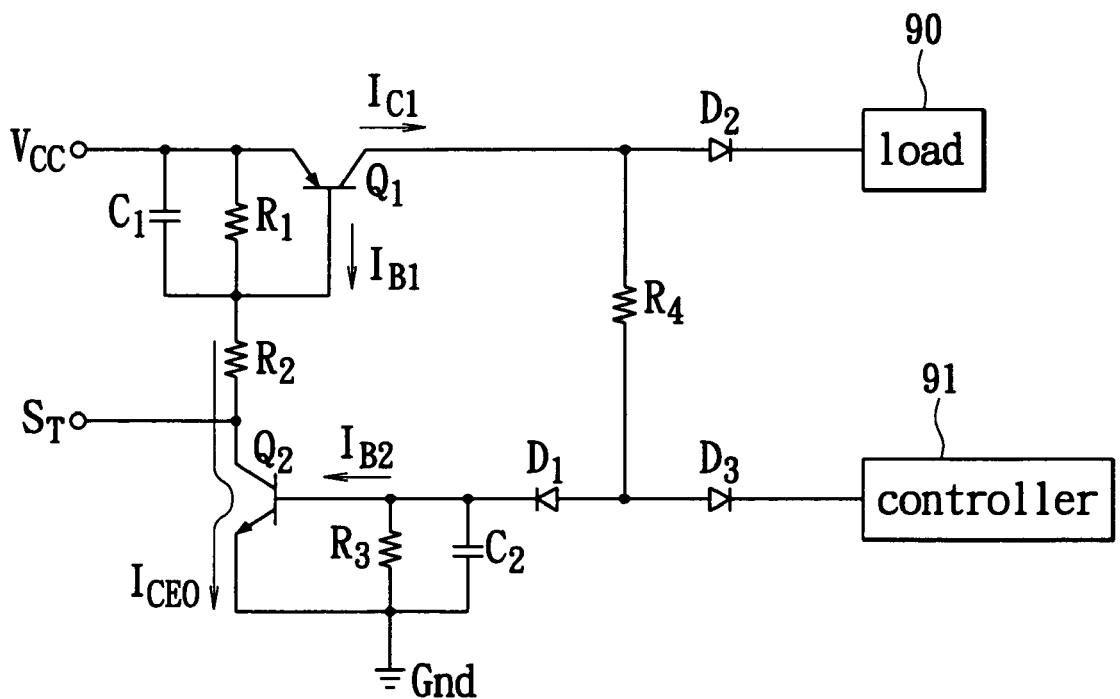
FIG. 1 is a circuit diagram of a prior art power supply switch circuit.
Figure 2:
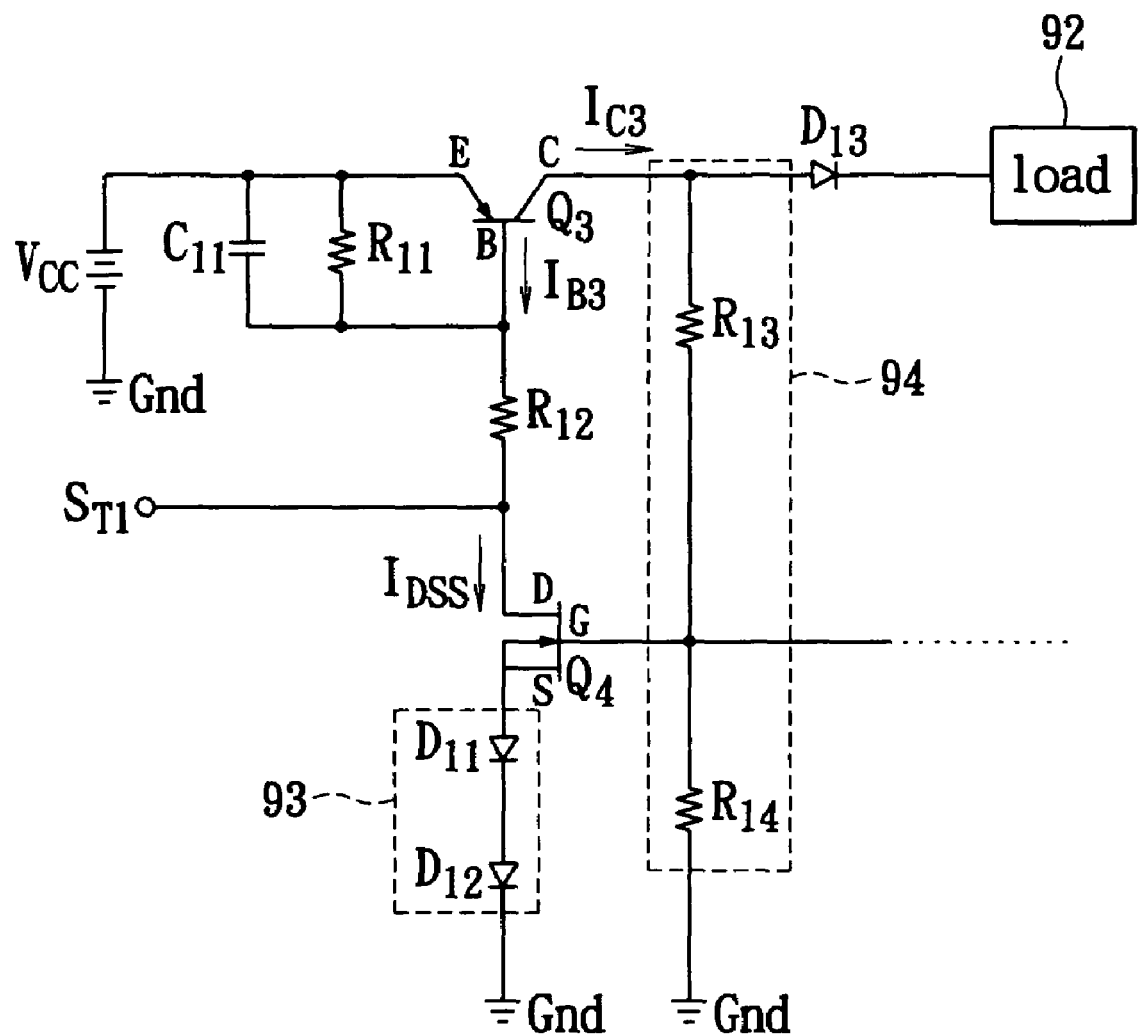
FIG. 2 is a circuit diagram of a power supply switch circuit with current leakage protection of the present invention.

FIG. 2 is a circuit diagram of a power supply switch circuit with current leakage protection of the present invention. The power supply switch circuit with current leakage protection is used in an electronic device (not shown), and can prevent the erroneous actions caused by a leakage current in high temperature environments. The power supply switch circuit with current leakage protection comprises a transistor $Q_3$, a field effect transistor $Q_4$ and a third resistor $R_{14}$. The transistor $Q_3$ has an emitter E, a base B and a collector C. The emitter E is connected to a voltage source $V_{CC}$. The collector C is connected to a load 92 via a forward biased diode $D_{13}$. The field effect transistor $Q_4$ has a drain D, a source S and a gate G. The drain D is connected to the base B of the transistor $Q_3$ via a first resistor $R_{12}$, and receives a trigger signal $S_{T1}$. The source S is connected to a reference terminal Gnd via a voltage clamp unit 93. The voltage clamp unit 93 provides a reference voltage, and is formed by series connecting at least two diodes ($D_{11}$, $D_{12}$) together in this embodiment. The gate is connected to the collector C of the transistor $Q_3$ via a second resistor $R_{13}$. One terminal of the third resistor $R_{14}$ is connected to the gate G of the field effect transistor $Q_4$, and the other terminal is connected to the reference terminal Gnd.

The second resistor $R_{13}$ and the third resistor $R_{14}$ are series connected together to form a voltage divider unit 94. The power supply switch circuit with current leakage protection of the present invention further comprises a capacitor $C_{11}$ and a fourth resistor $R_{11}$, which are parallel connected between the emitter E and the base B of the transistor $Q_3$. The transistor $Q_3$ is a PNP transistor, and the field effect transistor $Q_4$ is an N-channel field effect transistor.

Please refer to FIG. 2 again. When the power supply switch circuit supplies power normally, it receives a low-level trigger signal $S_{T1}$ for the activation of power supply. The low-level trigger signal $S_{T1}$ drives the transistor $Q_3$ to be on. After the transistor $Q_3$ is on, the voltage source $V_{CC}$ provides power to the load 92 via the transistor $Q_3$. Because the transistor $Q_3$ is on, the voltage source $V_{CC}$ will produce a large enough control bias on the resistor $R_{14}$ of the voltage divider unit 94 to drive the field effect transistor $Q_4$ to be on. When the control bias is larger than the sum of the on voltage of the field effect transistor $Q_4$ and the reference voltage, the field effect transistor $Q_4$ immediately enters the on state. After the field effect transistor $Q_4$ is on, the base B of the transistor $Q_3$ is connected to the reference terminal Gnd to keep the transistor $Q_3$ on, thereby continuing providing power to the load 92.

When the circuit stops providing power, the field effect transistor $Q_4$ will generates a leakage current $I_{DSS}$. When the temperature rises, the leakage current $I_{DSS}$ increases, and the base current $I_{B3}$ flowing through the transistor $Q_3$ increases therewith. Because the collector current $I_C$ is β times the base current $I_B$ according to the transistor's characteristics, the collector current $I_{C3}$ of the transistor $Q_3$ will increase with the base current $I_{B3}$. The increase of the collector current $I_{C3}$ of the transistor $Q_3$ will cause an increase in the voltage of the gate G of the field effect transistor $Q_4$. However, because the source S of the field effect transistor $Q_4$ is series connected to the voltage clamp unit 93 (i.e., at least two series-connected diodes $D_{11}$ and $D_{12}$), for the field effect transistor $Q_4$ to be on, the voltage of the gate G has to be larger than the sum of the pinch-off voltage $V_T$ of the field effect transistor $Q_4$ and the voltage drop across the at least two series-connected diodes $D_{11}$ and $D_{12}$.

When the present invention works in high-temperature environments, the increase of the leakage current $I_{DSS}$ will lead the base current $I_{B3}$ and the collector current $I_{C3}$ of the transistor $Q_3$ to rise in succession. However, because the voltage of the gate of the field effect transistor $Q_4$ generated when the collector current $I_{C3}$ flowing through the third resistor $R_{14}$ is still smaller than the sum of the pinch-off voltage $V_T$ of the field effect transistor $Q_4$ and the voltage drop across the at least two series-connected diodes $D_{11}$ and $D_{12}$, the field effect transistor $Q_4$ won't cause erroneous actions even if there is any variation in temperature. Therefore, the power supply switch circuit can work stably without any influence from transistor's leakage current in high-temperature environments.

Figure 3:
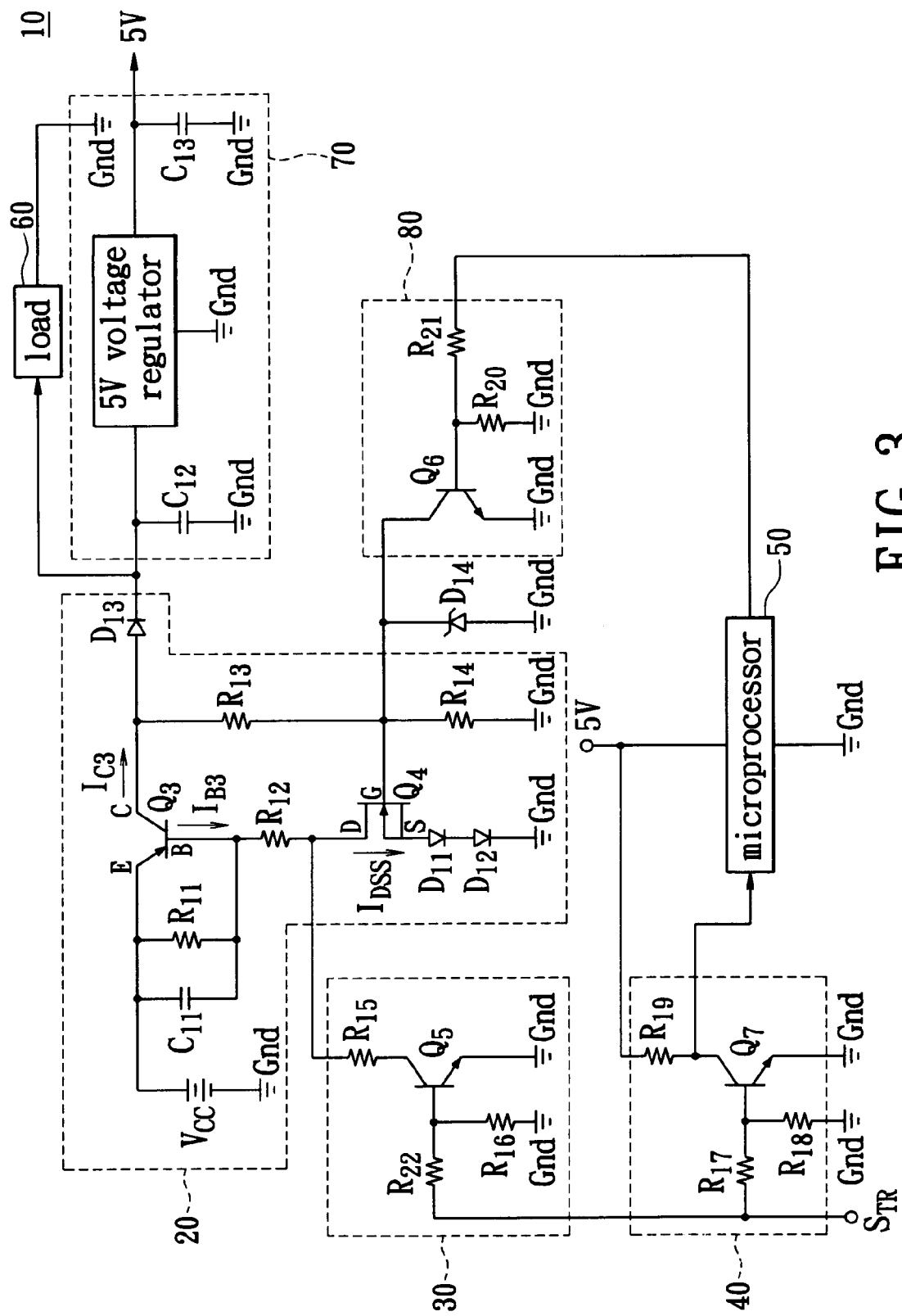
FIG. 3 is a circuit diagram showing how the present invention is used in an electronic device.

FIG. 3 is a circuit diagram showing how the present invention is used in an electronic device. An electronic device 10 receives a high-level trigger signal $S_{TR}$ for the activation of power supply. The high-level trigger signal $S_{TR}$ is connected to a power supply switch circuit 20 via a first switch unit 30, and is connected to a microprocessor 50 via a second switch unit 40. The high-level trigger signal $S_{TR}$ drives a transistor $Q_5$ in the first switch unit 30 to be on. After the transistor $Q_5$ is on, the base of the transistor $Q_3$ is connected to the reference terminal Gnd so that the transistor $Q_3$ is on. The voltage source $V_{CC}$ thus provides power to a load 60 and a voltage regulator 70 via the transistor $Q_3$. Because the transistor $Q_3$ is on, the voltage source $V_{CC}$ will produce a large enough control bias on the resistor $R_{14}$ of the voltage divider unit 94 to drive the field effect transistor $Q_4$ to be on. When the control bias is larger than the sum of the on voltage of the field effect transistor $Q_4$ and the reference voltage, the field effect transistor $Q_4$ immediately enters the on state to keep the transistor $Q_3$ on.

When the electronic device 10 is to stop providing power, it provides a low-level trigger signal $S_{TR}$ for end of power supply. The low-level trigger signal $S_{TR}$ drives a transistor $Q_7$ in the second switch unit 40 to be off. After the transistor $Q_7$ is off, the microprocessor 50 immediately outputs a high-level signal to drive a transistor $Q_6$ in a third switch unit 80 to be on. After the transistor $Q_6$ is on, the gate G of the field effect transistor $Q_4$ is connected to the reference terminal Gnd to drive the field effect transistor $Q_4$ to be off. After the field effect transistor $Q_4$ is off, the transistor $Q_3$ immediately enters the off state, and the voltage source $V_{CC}$ stops providing power to the load 60 and the voltage regulator 70.

When the electronic device 10 stops providing power, if the temperature rises, the leakage current $I_{DSS}$ of the field effect transistor $Q_4$ will increase, and the base current $I_{B3}$ flowing through the transistor $Q_3$ increases therewith. Because the collector current $I_C$ is β times the base current $I_B$ according to the transistor's characteristics, the collector current $I_{C3}$ of the transistor $Q_3$ will increase with the base current $I_{B3}$. The increase of the collector current $I_{C3}$ of the transistor $Q_3$ will cause an increase in the voltage of the gate G of the field effect transistor $Q_4$. However, because the source S of the field effect transistor $Q_4$ is series connected to the at least two series-connected diodes $D_{11}$ and $D_{12}$, for the field effect transistor $Q_4$ to be on, the voltage of the gate G has to be larger than the sum of the pinch-off voltage $V_T$ of the field effect transistor $Q_4$ and the voltage drop across the at least two series-connected diodes $D_{11}$ and $D_{12}$.

When the present invention works in high-temperature environments, the increase of the leakage current $I_{DSS}$ will lead the base current $I_{B3}$ and the collector current $I_{C3}$ of the transistor $Q_3$ to rise in succession. However, because the voltage of the gate of the field effect transistor $Q_4$ generated when the collector current $I_{C3}$ flowing through the third resistor $R_{14}$ is still smaller than the sum of the pinch-off voltage $V_T$ of the field effect transistor $Q_4$ and the voltage drop across the at least two series-connected diodes $D_{11}$ and $D_{12}$, the field effect transistor $Q_4$ won't cause erroneous actions even if there is any variation in temperature. Therefore, the power supply switch circuit can work stably with out any influence from transistor's leakage current in high-temperature environments.

To sum up, the present invention makes use of a PNP transistor and an N-channel field effect transistor to achieve current leakage protection so that the circuit won't produce erroneous actions due to the increase of leakage current in high-temperature environments.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. An electronic device receives a start signal for the activation of power supply, comprising:
    a first switch unit receiving the start signal and outputting a trigger signal;
    a PNP transistor connected to the first switch unit and conducted by the trigger signal;
    a voltage divider unit connected to said PNP transistor and used to output a control bias according to a conduction current of said PNP transistor;
    an N-channel field effect transistor connected to said PNP transistor and said voltage divider unit, conduction of said N-channel field effect transistor being controlled by said control bias and used to maintain said PNP transistor in an on state; and
    a voltage clamp unit connected to said N-channel field effect transistor and providing a reference voltage to increase the level of an ON voltage of said N-channel field effect transistor;
    a microprocessor; and
    a second switch unit connected to the microprocessor, wherein the second switch receives the start signal and controls the microprocessor to turn on the N-channel field effect transistor via a third switch unit.

2. The electronic device as claimed in claim 1, wherein said N-channel field effect transistor is connected to said PNP transistor via a first resistor.

3. The electronic device as claimed in claim 2, wherein said voltage divider unit comprises a second resistor and a third resistor being connected in series relation.

4. The electronic device as claimed in claim 3 further comprising a capacitor and a fourth resistor, wherein said capacitor and said fourth resistor are connected in parallel relation between an emitter and a base of said PNP transistor.

5. The electronic device as claimed in claim 4, wherein said voltage clamp unit comprises at least two diodes, and said diodes are connected in series relation.

6. The electronic device as claimed in claim 1, further comprising a load and a voltage regulator connected to the PNP transistor for receiving the voltage source respectively.

* * * * *